United States Patent [19]

Kane et al.

[11] 3,944,684
[45] Mar. 16, 1976

[54] PROCESS FOR DEPOSITING TRANSPARENT, ELECTRICALLY CONDUCTIVE TIN CONTAINING OXIDE COATINGS ON A SUBSTRATE

[75] Inventors: James Kane, Affoltern am Albis; Hanspeter Schweizer, Zurich, both of Switzerland

[73] Assignee: RCA Corporation, New York, N.Y.

[22] Filed: May 22, 1974

[21] Appl. No.: 472,294

Related U.S. Application Data

[63] Continuation-in-part of Ser. No. 391,359, Aug. 24, 1973.

[52] U.S. Cl. ............... 427/109; 427/126; 427/248; 427/255
[51] Int. Cl.² ................ B05D 5/12; C23C 11/08
[58] Field of Search ......... 117/106 R, 211; 427/109, 427/126, 255, 248

[56] References Cited
UNITED STATES PATENTS

| | | |
|---|---|---|
| 2,567,331 | 9/1951 | Gaiser et al. .................... 117/211 |
| 2,617,742 | 11/1952 | Olson ............................. 117/211 |
| 2,694,649 | 11/1954 | Tarnopol ......................... 117/211 |
| 2,740,731 | 4/1956 | Lytle et al. ..................... 117/211 |
| 2,833,902 | 5/1953 | Gaiser et al. .................... 117/211 |
| 2,932,590 | 4/1960 | Barrett et al. ................... 117/211 |
| 3,107,177 | 10/1963 | Saunders et al. ................. 117/211 |
| 3,647,531 | 3/1972 | Matsushita et al. ............... 117/211 |
| 3,658,568 | 4/1972 | Donley ......................... 117/106 R |
| 3,663,857 | 5/1972 | Soellner et al. .................. 117/211 |
| 3,705,054 | 12/1972 | Matsushita et al. ............... 117/211 |

*Primary Examiner*—Cameron K. Weiffenbach
*Attorney, Agent, or Firm*—Glenn H. Bruestle; Arthur E. Wilfond; Birgit E. Morris

[57] ABSTRACT

Certain volatile organotin compounds are vaporized in a heated carrier gas stream and brought into contact with a preheated substrate to be coated in an atmosphere containing oxygen. Indium oxide coatings may be doped with tin by vaporizing an organotin compound and an indium chelate of a β-diketone and bringing the vapors in contact with a heated substrate in an oxidizing atmosphere.

11 Claims, 2 Drawing Figures

PROCESS FOR DEPOSITING TRANSPARENT, ELECTRICALLY CONDUCTIVE TIN CONTAINING OXIDE COATINGS ON A SUBSTRATE

CROSS REFERENCES TO RELATED APPLICATIONS

This application is a continuation-in-part of our copending application Ser. No. 391,359 filed Aug. 24, 1973. A process for depositing indium oxide coatings is disclosed in copending application of Kane, Ser. No. 341,693 filed Mar. 15, 1973, and issued as U.S. Pat. No. 3,854,992 on Dec. 17, 1974.

This invention relates to depositing tin containing oxide coatings. More particularly, this invention relates to a process for fabricating transparent, electrically conductive coatings of tin and indium oxides by chemical vapor deposition.

BACKGROUND OF THE INVENTION

Transparent, conductive tin oxide coatings on substrates such as glass, are widely employed for windshields, display devices, faceplates of cathode ray tubes, liquid crystal cells and the like. For the fabrication of faceplates of cathode ray tubes or vidicon faceplates, for example, electrical conductivity, measured as resistivity, should be on the order of less than 50,000 ohms per square and transparency, measured as percent light transmission in the visible range, should be over 80%. The most widely employed commercial process for fabricating tin oxide coatings is based on the pyrolysis of tin halide compounds. A compound such as stannic chloride is dissolved in a solvent and the solution sprayed onto the surface of a preheated substrate where the stannic chloride is pyrolized to form tin oxide. This method is inexpensive but is difficult to control to fabricate uniform, haze-free coatings, probably due to the action of hydrochloric acid, a by-product of the reaction, on the surface of the substrate.

The pyrolysis of organotin compounds has been tried. U.S. Pat. No. 2,567,331 discloses a method of applying a conductive, transparent coating of tin oxide to a glass substrate by spraying liquified dibutyl tin diacetate onto the glass which was preheated to its melting point. The resultant coating, while electrically conducting, had a less than satisfactory transmission of 58% and a high reflectivity of 20%. Some improvement was obtained by spraying the tin compound dissolved in an alcohol solvent, when transmission was increased and reflectivity was decreased. Very high spray temperatures are required for this process, however, on the order of 600°–700°C., which severely limit the substrates that can be employed and largely preclude the use of inexpensive, ordinary glass substrates. Another disadvantage of this process is that the tin oxide coating had a brownish appearance.

U.S. Pat. No. 3,107,177 discloses an improvement in the above process whereby fluorine is introduced into the tin oxide coating. The resultant tin oxide coatings have improved conductivity, but again, high temperatures are required which result in distortion or warping of low melting substrates such as glass.

Transparent, conductive coatings of tin oxide and indium oxide mixtures are employed in electro-optic devices such as liquid crystal display panels. The most widely used techniques for depositing this type of coating are radio frequency sputtering and electron beam evaporation. These techniques produce excellent coatings but require costly equipment, high electrical consumption and have a relatively low production rate.

Thus, a process for preparing transparent, haze-free, conductive coatings of tin oxide or tin oxide and indium oxide mixtures which is rapid and inexpensive and can be carried out at low temperatures would be highly desirable.

SUMMARY OF THE INVENTION

We have found that thin, uniform, transparent electrically conducting coatings of tin-containing oxide films can be deposited by chemical vapor deposition, e.g., tin oxide can be deposited onto a low melting substrate in a simple, inexpensive manner by vaporizing certain volatile organotin compounds and contacting the vapor with a heated substrate in the presence of an oxidizing gas. Oxide films of tin and indium can be deposited onto a substrate by contacting the substrate with the vapors of a volatile indium chelate of a $\beta$-diketone and the vapors of a volatile organotin compound in an oxidizing atmosphere.

DETAILED DESCRIPTION OF THE INVENTION

Figures 1, 2:
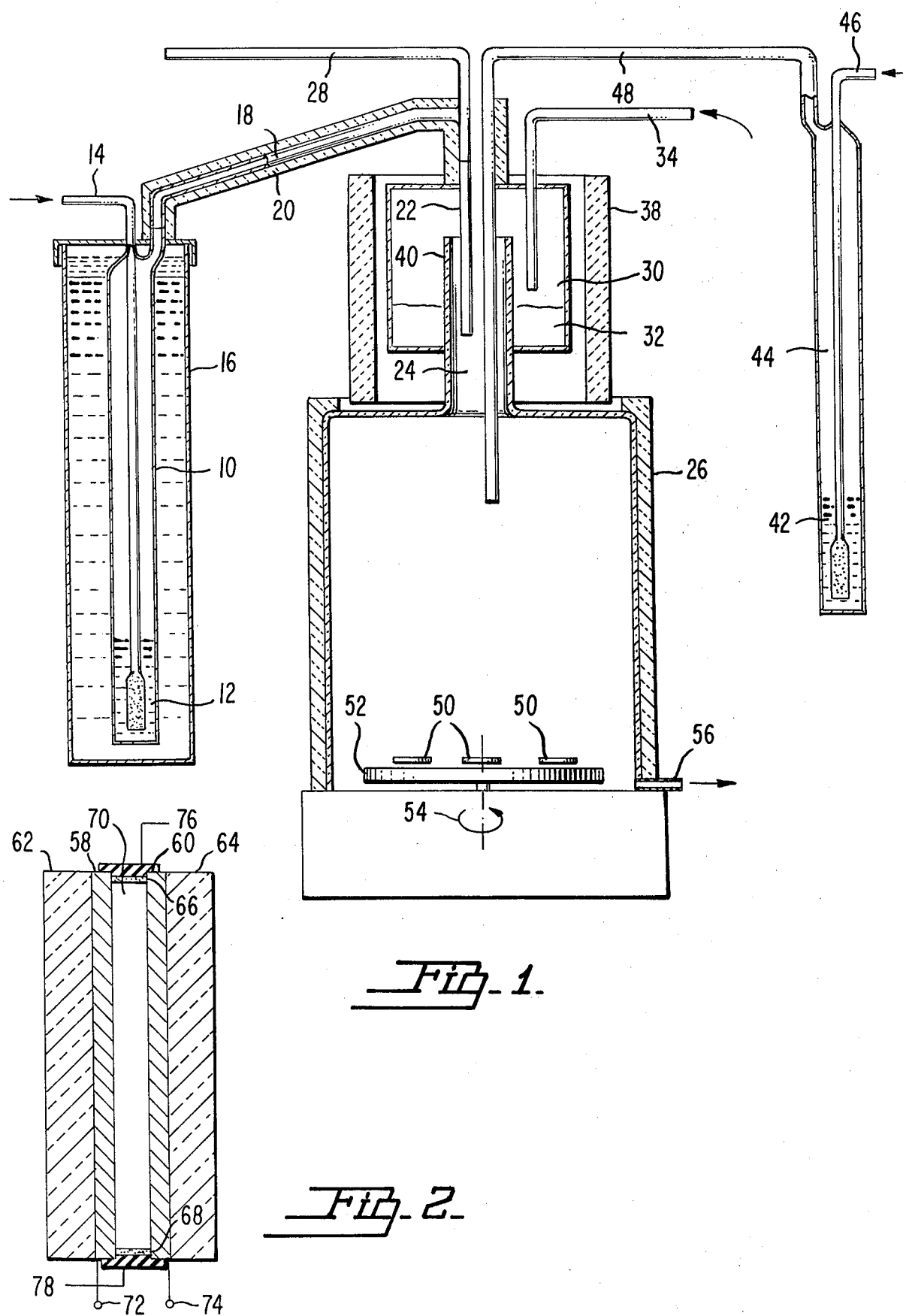
FIG. 1 is a sectional elevational view of an apparatus suitable for carrying out the process of the invention.
FIG. 2 is a sectional elevation view of a liquid crystal cell using electrodes deposited by the process of the invention.

According to the present process, certain organo-tin compounds which are volatile at low temperatures can be vaporized in a heated carrier gas stream and transported to a reaction chamber having an oxygen atmosphere, or an oxygen atmosphere also containing water, where the vapor is contacted with a preheated substrate. This process can be used to dope indium oxide coatings with tin, by vaporizing an organotin compound simultaneously with an indium chelate of a $\beta$-diketone in a carrier gas stream and contacting the vapors on a heated substrate in an oxidizing atmosphere.

The organotin compounds suitable for use in the present process are compounds that are volatile at temperatures below about 200°C., such as compounds having the formula $(R\text{+}_2Sn\text{+}OOCR)_2$ or $(R_3Sn\text{+}_2O$ wherein R is a lower alkyl group. Suitable compounds include dibutyl tin diacetate, bis(tri-n-propyl) tin oxide and bis(tri-n-butyl) tin oxide, for example. These organotin compounds may be vaporized by heating to a temperature between about 80° to 150°C., preferably between about 100° to 120°C. They may be vaporized by heating in a boiling water bath, i.e., a temperature about 100°C. Other organotin compounds which may be used to deposit a tin containing oxide film include tetraphenyl tin and tetraisopropyl tin.

An indium compound useful in the present process is an indium chelate of a $\beta$-diketone. A preferred compound is the indium chelate of 2,2,6,6-tetramethylheptane-3,5-dione prepared by the method described by Eisentraut et al., JACS 87, 5254 (1965) for the preparation of the corresponding rare earth chelate compounds.

This chelate has the structure

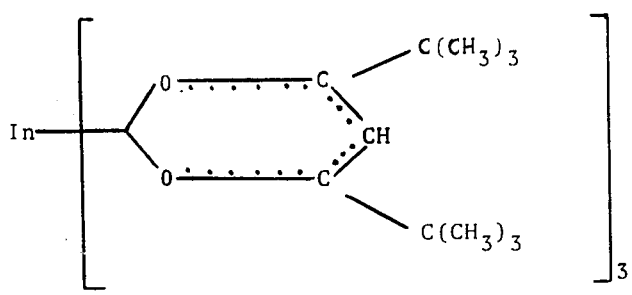

This indium chelate has a melting point of 173°C. and can be volatilized and transported in an inert gas stream at temperatures above about 180°C. The indium chelate of 2,2,6,6-tetramethylheptane-3,5-dione is thermally stable up to about 250°C. A copending application of Kane, Ser. No. 341,693 filed Mar. 15, 1973 discloses the use of this indium chelate to form indium oxide coatings.

The carrier gas can be any inert gas or gas mixture, such as one or more of neon, argon, krypton, nitrogen and the like and can contain oxygen as well. The carrier gas may be preheated, e.g., the carrier gas for carrying the vapor of an indium chelate is preheated to a temperature between 180°–250°C., preferably 200°–250°C.

The oxygen-containing gas can be oxygen or oxygen admixed with an inert gas, such as nitrogen. Water vapor can be present. The gas flows should be maintained at a level adequate to ensure sufficient oxygen in the reaction chamber for reaction of the organotin compound to form tin oxide to occur. If the oxide concentration is too low, the resultant tin oxide-containing films have decreased conductivity. The presence of water vapor in the oxygen-containing gas generally improves conductivity of the tin oxide-containing film.

When mixed films of tin and indium oxide are prepared the substrate temperature should be in the range of 350°–550°C.; temperatures on the order of 450°–500°C. are preferred. Too low a temperature results in an inefficiently low rate of reaction. Very high temperatures of reaction limit the nature of the substrate that can be employed.

The time required for deposition can vary from about five minutes up to an hour or more, depending on the temperatures of the carrier gas and the substrate and the thickness of the tin containing oxide coating desired. In general, coatings of high transparency and good electrical conductivity can be formed in about 5–15 minutes. Extended reaction times may result in increasing migration of impurities into the coating from the substrate or cause irreversible change in the coating, e.g., crystallization which could result in a decrease in electrical conductivity. If the thickness of the film is too thin, i.e., less than 500 A, conductivity is low; if it is too large, i.e., more than 5000 A, transparency will be adversely affected.

The present process can deposit thin tin oxide-containing coatings on a variety of substrates which are heat resistant of deposition temperatures. Although glass has been referred to particularly hereinabove, other inert substrates such as quartz, sapphire, garnet, alumina, silicon, gallium arsenide, spinel, magnesium oxide, strontium titanate, gallium phosphide and the like, can be substituted.

When an apparatus is employed whereby the substrates to be coated are rotated during deposition of the tin containing oxide coating, such as is shown in FIG. 1, slight variations in the temperature of the substrate, gas flow rate, volume and the like, are not critical and will not adversely affect the uniformity of the tin oxide coating deposited. However, if the substrates to be coated are mounted on a stationary platform, the gas flow rates, temperatures, relative amounts of incoming gases and the like must be more carefully regulated to ensure uniform tin oxide containing coatings. Optimum parameters of these variables for each organotin compound, indium chelate, and apparatus employed can be determined by a series of test runs as will be known to one skilled in the art. An apparatus suitable for practicing the present invention is illustrated in FIG. 1, but it is understood that various changes in design can be made, as will be known to one skilled in the art.

Referring to FIG. 1, a carrier gas is introduced into a closed container 10 for the organotin compound 12 via an inlet tube 14. The container 10 is immersed in a boiling water bath 16. The temperatures of the boiling water bath is about 98°C. The carrier gas and the volatized organotin compound passes via a tube 18 which is encased in a heater tape 20 maintained at about 135°C., to an inlet tube 22 and into the top portion 24 of the reaction chamber 26. Additional carrier gas may be admitted into the inlet tube 22 via a second carrier gas inlet tube 28 to control the carrier gas flow.

A carrier gas is introduced into a closed container 30 for the indium chelate of 2,2,6,6-tetramethylheptane-3,5-dione 32 via an inlet tube 34. The carrier gas and indium chelate are heated to a temperature of between about 180°C. to 250°C. in a furnace 38. The preferred temperature is between about 200°–250°C. The indium container 30 and the furnace 38 may be placed apart from the reaction chamber 26 or may be mounted on top of the reaction chamber 26 as illustrated in FIG. 1. The carrier gas and the indium chelate vapors are transported into the top portion 24 of the reaction chamber 26 via an inlet tube 40.

The organotin vapors and the indium chelate vapors mix in the top portion 24 of the reaction chamber 26 prior to the introduction of the reactant gas stream. The reactant gas stream is an oxygen containing carrier gas saturated with water by bubbling it through a water 42 contained in a bubbler 44 via an inlet tube 46. The temperature of the water 42 is about 23°C. The reactant gas stream is introduced into the reaction chamber 26 via an inlet tube 48 which extends well into the reaction chamber 26 and past the top portion 24 of the reaction chamber 26.

The substrates 50 to be coated with the tin containing indium oxide film are mounted on a heated platform 52 and heated to a temperature of between about 350° to 550°C. The preferred temperature for the substrates 50 is a temperature of between about 450° to 500°C. The platform 52 is slowly rotated on a shaft 54 turned by a motor (not shown) to evenly coat the substrates. Spent gases exit from the reaction chamber 26 via an outlet tube 56.

The deposition rate of the oxide coating is controlled by the rate of introduction of the organo-metallic compounds. It is also dependent on the substrate temperature. Using the above apparatus and conditions, it is possible to achieve deposition rates up to 1000 Angstroms/minute. Better control of the reaction is achieved by restricting the deposition rate to a rate of between about 200–500 Angstroms/minute.

The invention will be further illustrated by the following examples, but it is to be understood that the invention is not meant to be limited to the details described therein.

A series of quartz plates and polished silicon wafers were coated with tin doped indium oxide in an apparatus described above. The deposition parameters of the temperature of deposition and the gas flow rates were changed in a systematic manner so that a series of coatings with gradually decreasing tin concentration were obtained. The flow rate of the oxygen-containing gas stream was 1500 cc/minute of $N_2$ and 300 cc/minute of $O_2$ through water. The indium furnace was maintained at a temperature of about 220°C. The water bath for vaporizing the tin had a temperature of about 98°C. The indium chelate of 2,2,6,6-tetramethylheptane-3,5-dione was used as the volatile indium compound. Dibutyl tin diacetate was used as the volatile tin compound. The deposition parameters, together with the thickness and composition data, on this series are presented in Table I.

All films were deposited in a 4 inch diameter reactor and were soluble in 37% HCl at 70°C. within 3 minutes. All films were dissolved off the quartz substrates in 37% HCl at 70°C. The indium content of the films was determined by wet chemical quantitative microanalysis. Tin concentrations were measured by atomic absorption analysis with an error limit of approximately 5%.

Mass spectrographic analysis was employed to examine the impurities in a typical film (Sample 5) deposited on a high-purity silicon. The results, expressed in ppm atomic based on $In_2O_3$ = 100% (the value for In is therefore 400,000 ppma) indicate the film is quite pure with highest concentration of impurities being for iron (5.4 ppm) and chlorine (1.4 ppm). The Sn/In atomic ratio is 0.0600 which agrees reasonably well with the weight ratio of 0.0744 (=0.0672 atomic) determined by chemical analysis.

step in the tin doped indium oxide layer using dilute hydrochloric acid. The sheet resistivity was measured in a conventional manner using a four-part probe having a point separation of the probe of 10 mils. The substrate temperatures were recorded directly on the surface of the hotplate reactor with bimetallic temperature indicators. The deposition time was 10 minutes for all samples. Both quartz and polished silicon substrates were coated. The optical readings were from the quartz substrates. The optical transmission of the films was measured by comparing the light transmitted by a coated quartz substrate with an uncoated substrate in the reference beam. The data for the optical transmission and resistivity of the samples are given in Table II.

Tables I and II also give comparable data for films of indium oxide and tin oxide alone. The indium oxide data is taken from that recorded for sample E in Table I disclosed in Example 1 of copending application of Kane, Ser. No. 341,693 filed Mar. 15, 1973. The tin oxide data is taken from that recorded for Sample D of Table I for Example 1 of copending application of Kane, et al. filed Aug. 24, 1973 of which this application is a continuation-in-part.

The present invention can be used to deposit thin transparent indium and tin oxide mixtures useful as electrodes in liquid crystal cells for display devices. Referring now to FIG. 2, one or more thin coatings 58 and 60 of a mixture of indium and tin oxide about 1000 to 1500 A thick are deposited on one or more clear plates 62 and 64, e.g., glass plates, by the method described above. The most important criterion for a liquid crystal electrode is the measured sheet resistance after processing. This sheet resistance should not exceed 200 $\Omega$/square. The indium and tin oxide coated glass plates 62 and 64 form a liquid crystal cell by disposing the indium and tin oxide coated surfaces 58 and 60 of the glass plates 62 and 64 parallel to and opposite to each other and separating the coated surfaces 58 and 60 with spacers 66 and 68. The spacing between the indium and tin oxide coatings may vary from about 5 to 50 $\mu$ with nominal values being in the 10–20 $\mu$ range. A liquid crystal material 70, which is either highly ordered or highly disordered when a voltage is applied across it, is placed between the two electrodes 58 and 60. The electrodes 58 and 60 are connected to leads 72 and 74 connected to a voltage source (not shown). The liquid crystal cell is sealed with hermetic, water-tight seals 76 and 78.

TABLE I

| Sample | Deposition Temp., °C. | Gas Flow Sn-$N_2$, cc/min. | In-$N_2$, cc/min. | Ratio Sn-$N_2$ In-$N_2$ | Film Thickness A | Sn, mg | In, mg | Sn/In weight ratio |
|---|---|---|---|---|---|---|---|---|
| 1 | 475 | 420 | 1160 | 0.363 | ~1,360 | 0.108 | 0.913 | 0.118 |
| 2 | 505 | 420 | 1160 | 0.363 | ~2,040 | 0.125 | 1.350 | 0.0926 |
| 3 | 530 | 420 | 1160 | 0.363 | ~3,410 | 0.036 | 0.420 | 0.0857 |
| 4 | 530 | 1160 | 1160 | 1.000 | — | — | — | — |
| 5 | 530 | 1160 | 420 | 2.760 | — | — | — | — |
| 6 | 555 | 420 | 1160 | 0.363 | 4,818 | 0.158 | 3.200 | 0.0494 |
| 7 | 555 | 420 | 2040 | 0.206 | 7,442 | 0.318 | 7.100 | 0.0448 |
| 8 | 555 | 1160 | 1160 | 1.000 | 7,458 | 0.608 | 8.175 | 0.0744 |
|  |  |  |  |  |  | by mass spec. |  | 0.0672 |
| Indium oxide alone | 450 | — | 700 | — | — | — | — | — |
| Tin oxide alone | 450 | 1130 | — | — | 1,300 | — | — | 1 |

Thickness measurements were made using a Sloan "Dektak" fitted with a 25 micron stylus after etching a

TABLE II

| Sample | % Transmission 4000–4800 A | % Transmission 5200–6000 A | Sheet Resistance ohm/square | Film Resistivity $10^{-4}$ ohm/cm |
|---|---|---|---|---|
| 1 | 74–86 | 95–100 | 90.7 | ~12.2 |
| 2 | 74–99 | 95–84 | 28.5 | ~5.82 |
| 3 | 70–80 | 92–89 | 14.0 | ~4.77 |
| 4 | 61–80 | 87–88 | 9.0 | — |
| 5 | 39–82 | 89–100 | 39.4 | — |
| 6 | 85–99 | 83–99 | 10.0 | 4.82 |
| 7 | 57–68 | 71–76 | 2.95 | 2.20 |
| 8 | 52–72 | 73–76 | 9.5 | 7.10 |
| Indium oxide alone | 72.5–97 | 98–94.3 | 1360 | — |
| Tin oxide alone | 92.4–99.6 | 97.4–91 | 6000 | — |

What is claimed is:

1. The process of depositing an oxide coating containing tin and indium on a substrate which comprises:
   a. vaporizing an indium chelate of 2,2,6,6-tetramethylheptane-3,5-dione,
   b. vaporizing an organotin compound having a vaporization temperature below about 200°C.,
   c. heating said substrate to a temperature of from about 350°C. to about 550°C., and
   d. contacting said heated substrate with said indium vapor and said tin vapor in an oxidizing atmosphere.

2. The process of claim 1 wherein said indium chelate is vaporized by heating at a temperature of from about 180° to about 250°C.

3. The process of claim 2 wherein said indium chelate is vaporized by heating at a temperature of between about 200° to 250°C.

4. The process of claim 1 wherein the organotin compound is selected from the group consisting of $(R)_2Sn(OOCR)_2$ and $(R_3Sn)_2O$ compounds wherein R is a lower alkyl group.

5. The process of claim 4 wherein said organotin compound is vaporized by heating to a temperature from about 80° to about 200°C.

6. The process of claim 1 wherein said organotin compound is selected from a group comprising dibutyl tin diacetate, bis(tri-n-propyl) tin oxide and bis(tri-n-butyl) tin oxide.

7. The process of claim 1 wherein said substrate is heated to a temperature between about 450°C.

8. The process of claim 1 wherein said oxidizing atmosphere contains water vapor.

9. The process of depositing transparent, uniform, electrically conductive tin doped indium oxide coatings on a substrate comprising:
   a. vaporizing an indium chelate of 2,2,6,6-tetramethylheptane-3,5-dione at a temperature of from about 180° to about 250°C.,
   b. vaporizing dibutyl tin diacetate at a temperature of from about 80°C. to about 120°C.,
   c. heating said substrate to a temperature of from about 350°C. to about 550°C.,
   d. and contacting said heated substrate with said indium vapor and said tin vapor in an oxidizing atmosphere.

10. The process of claim 9 wherein the oxidizing atmosphere contains water vapor.

11. The process of claim 9 wherein the substrate is a clear glass plate having a melting temperature above about 450°C. and said tin doped indium oxide film forms an electrode for use in a liquid crystal cell.

* * * * *

UNITED STATES PATENT OFFICE
CERTIFICATE OF CORRECTION

PATENT NO. : 3,944,684
DATED : March 16, 1976
INVENTOR(S) : James Kane et al

It is certified that error appears in the above-identified patent and that said Letters Patent are hereby corrected as shown below:

Column 3, line 62     "of" should be "at"

Column 4, line 32     "temperatures" should be "temperature"

Claim 7, line 2       after "450°C." insert "to 500°C."

*Signed and Sealed this eighth Day of June 1976*

[SEAL]

Attest:

RUTH C. MASON
*Attesting Officer*

C. MARSHALL DANN
*Commissioner of Patents and Trademarks*